(12) United States Patent
Liu et al.

(10) Patent No.: US 11,751,432 B2
(45) Date of Patent: Sep. 5, 2023

(54) DISPLAY DEVICE, FLEXIBLE DISPLAY PANEL AND MANUFACTURING METHOD THEREFOR

(71) Applicant: BOE TECHNOLOGY GROUP CO., LTD., Beijing (CN)

(72) Inventors: Xiaoyun Liu, Beijing (CN); Liangliang Kang, Beijing (CN); Xiaofen Wang, Beijing (CN); Qian Jin, Beijing (CN); Tun Liu, Beijing (CN); Yan Fan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 464 days.

(21) Appl. No.: 17/251,863

(22) PCT Filed: May 7, 2020

(86) PCT No.: PCT/CN2020/089048
§ 371 (c)(1),
(2) Date: Dec. 14, 2020

(87) PCT Pub. No.: WO2020/233413
PCT Pub. Date: Nov. 26, 2020

(65) Prior Publication Data
US 2021/0257421 A1 Aug. 19, 2021

(30) Foreign Application Priority Data
May 23, 2019 (CN) .......................... 201910435464.8

(51) Int. Cl.
*H10K 59/12* (2023.01)
*H10K 50/844* (2023.01)
(Continued)

(52) U.S. Cl.
CPC .......... *H10K 59/12* (2023.02); *H10K 50/844* (2023.02); *H10K 71/00* (2023.02); *H10K 77/111* (2023.02); *H10K 59/1201* (2023.02)

(58) Field of Classification Search
None
See application file for complete search history.

(56) References Cited

U.S. PATENT DOCUMENTS 9,698,205 B2 7/2017 Jeong et al.
10,205,122 B2 2/2019 Choi et al.
(Continued)

FOREIGN PATENT DOCUMENTS

CN 106887523 A 6/2017
CN 108649054 A 10/2018
(Continued)

OTHER PUBLICATIONS

International Search Report and Written Opinion for International Application No. PCT/CN2020/089048 dated Aug. 6, 2020.
(Continued)

*Primary Examiner* — J. E. Schoenholtz
(74) *Attorney, Agent, or Firm* — Perilla Knox & Hildebrandt LLP; Kenneth A. Knox

(57) ABSTRACT

The present disclosure relates to the technical field of display, and provided thereby are a display device, a flexible display panel and a manufacturing method therefor. The flexible display panel comprises a flexible substrate and a plurality of pixel islands arranged in an array on the flexible substrate; the pixel islands have a display region and a peripheral region surrounding the display region, and each pixel island comprises a driving layer, a first electrode layer, a light emitting layer and a second electrode layer that are sequentially stacked on the flexible substrate; the first electrode layer comprises a first electrode located in the display (Continued)

region and a peripheral electrode located in the peripheral region; the peripheral electrode surrounds the display region, and a surface of the peripheral electrode away from the flexible substrate is provided with a barrier structure surrounding the display region, a preset spacing being present between the barrier structure and the display region; and the light emitting layer is intermittently provided in a region directly opposite to the barrier structure and a region located within a range of the preset spacing.

15 Claims, 7 Drawing Sheets

(51) Int. Cl.
  *H10K 71/00* (2023.01)
  *H10K 77/10* (2023.01)

(56) References Cited

U.S. PATENT DOCUMENTS

| | | | |
|---|---|---|---|
| 10,396,311 | B2 | 8/2019 | Lee et al. |
| 10,580,837 | B2 | 3/2020 | Lee et al. |
| 2016/0111481 | A1 | 4/2016 | Jeong et al. |
| 2017/0040395 | A1 | 2/2017 | Jeong et al. |
| 2017/0148856 | A1 | 5/2017 | Choi et al. |
| 2018/0374907 | A1 | 12/2018 | Choi et al. |
| 2019/0074479 | A1 | 3/2019 | Lee et al. |
| 2020/0184856 | A1 | 6/2020 | Wang et al. |
| 2021/0183838 | A1* | 6/2021 | Jung ............... H10K 59/18 |
| 2021/0226154 | A1* | 7/2021 | Ban ............... H10K 50/816 |
| 2021/0336203 | A1* | 10/2021 | Sun ............... H10K 59/124 |

FOREIGN PATENT DOCUMENTS

| | | |
|---|---|---|
| CN | 109427861 A | 3/2019 |
| CN | 109742121 A | 5/2019 |
| CN | 209087845 U | 7/2019 |
| CN | 110112317 A | 8/2019 |

OTHER PUBLICATIONS

First Office Action for CN Patent Application No. 201910435464.8 dated Aug. 28, 2020.

* cited by examiner

DISPLAY DEVICE, FLEXIBLE DISPLAY PANEL AND MANUFACTURING METHOD THEREFOR

CROSS-REFERENCE TO RELATED APPLICATIONS

This application is a national phase application under 35 U.S.C. § 371 of International Application No. PCT/CN2020/089048, filed May 7, 2020, which claims the benefit of and priority to Chinese Patent Application No. 201910435464.8 filed on May 23, 2019, the contents thereof being incorporated by reference in their entireties herein.

TECHNICAL FIELD

The present disclosure relates to the field of display technology and, in particular to a display apparatus, a flexible display panel, and a manufacturing method thereof.

BACKGROUND

Presently, flexible display panels have received extensive attention. Among them, stretchable flexible display panels are gaining more and more attention. Existing stretchable flexible display panels generally divide into a plurality of display units by opening hollow areas. Due to existence of the hollow area, the flexible display panel can be stretched and deformed. However, external water and oxygen will erode from the hollow area to the display area, thereby affecting the display effect.

It should be noted that the information disclosed in the background art section above is only used to enhance the understanding of the background of the present disclosure, and therefore may include information that does not constitute the prior art known to those of ordinary skill in the art.

SUMMARY

The present disclosure aims to provide a display apparatus, a flexible display panel, and a manufacturing method thereof.

According to an aspect of the present disclosure, there is provided a flexible display panel, comprising a flexible substrate and a plurality of pixel islands arranged in an array on the flexible substrate, wherein the pixel island has a display area and a peripheral area surrounding the display area, and each of the pixel islands comprises a driving layer, a first electrode layer, a light emitting layer and a second electrode layer sequentially laminated on the flexible substrate, wherein the first electrode layer comprises a first electrode located in the display area and a peripheral electrode located in the peripheral area, the peripheral electrode surrounds the display area, and a surface of the peripheral electrode away from the flexible substrate is provided with a blocking structure surrounding the display area, a preset interval exists between the blocking structure and the display area; and an area of the light emitting layer located in a range of the blocking structure and an area of the light emitting layer located in a range of the preset interval are interruptedly arranged.

In an exemplary embodiment of the present disclosure, the blocking structure is a ring-shaped rib, the rib has a height greater than a thickness of the light emitting layer; the area of the light emitting layer located in a range of the blocking structure is an area where the light emitting layer is located on a surface of the rib away from the first electrode layer; or the blocking structure is a ring-shaped recess, the recess has a depth greater than the thickness of the light emitting layer; the area of the light emitting layer located in a range of the blocking structure is an area of the light emitting layer located on a bottom surface of the recess.

In an exemplary embodiment of the present disclosure, the blocking structure is a ring-shaped rib made of conductive material, an area where the second electrode layer is located on a surface of the rib away from the first electrode layer and an area where the second electrode layer is located in a range of the preset interval are interruptedly arranged, and the area where the second electrode layer is located in a range of the preset interval is in contact with an inner wall of the rib.

In an exemplary embodiment of the present disclosure, the rib comprises:

a first conductive layer, arranged on a surface of the peripheral electrode away from the flexible substrate and surrounding the display area;

a second conductive layer, arranged on a surface of the first conductive layer away from the flexible substrate, and the area where the second electrode layer is located in a range of the preset interval is in contact with an inner wall of the second conductive layer.

In an exemplary embodiment of the present disclosure, the first conductive layer and the peripheral electrode are formed in an integral structure made of transparent conductive material; and the second conductive layer is made of metal.

In an exemplary embodiment of the present disclosure, the rib further comprises:

a protective layer, arranged on a surface of the second conductive layer away from the flexible substrate.

In an exemplary embodiment of the present disclosure, an angle between a cross section perpendicular to the flexible substrate in the rib and a surface of the first electrode layer away from the flexible substrate is not less than 90° and not more than 100°.

In an exemplary embodiment of the present disclosure, the driving layer comprises:

an active layer, arranged on the flexible substrate and located in the display area;

a gate insulating layer, covering the active layer and the flexible substrate;

a gate electrode, arranged on a surface of the gate insulating layer away from the flexible substrate and directly opposite to the active layer;

a dielectric layer, covering the gate electrode and the gate insulating layer;

a source-drain layer, arranged on a surface of the dielectric layer away from the gate electrode, and the source-drain layer comprising a source electrode and a drain electrode connected to the active layer;

a driving electrode, arranged on a surface of the dielectric layer away from the gate electrode and located in the peripheral area;

a flat layer, covering the dielectric layer, the source-drain layer, and the driving electrode, and the first electrode layer being provided on a surface of the flat layer away from the flexible substrate, wherein the drain electrode is connected to the first electrode through a first via hole in the flat layer; and the driving electrode is connected to the peripheral electrode through a second via hole in the flat layer.

According to an aspect of the present disclosure, there is provided a method for manufacturing a flexible display panel, wherein the flexible display panel comprises a flexible substrate and a plurality of pixel islands arranged in an array on the flexible substrate, the pixel island has a display area and a peripheral area surrounding the display area, and the manufacturing method comprises:

forming a driving layer of each pixel island on one side of the flexible substrate;

forming a first electrode layer of each pixel island on a surface of each driving layer away from the flexible substrate, wherein the first electrode layer comprises a first electrode located in the display area and a peripheral electrode located in the peripheral area, and the peripheral electrode surrounds the display area;

forming a blocking structure surrounding the display area on a surface of each peripheral electrode away from the flexible substrate, wherein a preset interval exists between the blocking structure and the display area;

forming a light emitting layer of each pixel island on a surface of each first electrode layer away from the flexible substrate, wherein an area of the light emitting layer located in a range of the blocking structure and an area of the light emitting layer located in a range of the preset interval are interruptedly arranged; and forming a second electrode layer of each pixel island on a surface of each light emitting layer away from the flexible substrate.

In an exemplary embodiment of the present disclosure, the blocking structure is a ring-shaped rib, the rib has a height greater than a thickness of the light emitting layer; the area of the light emitting layer located in a range of the blocking structure is an area where the light emitting layer is located on a surface of the rib away from the first electrode layer; or the blocking structure is a ring-shaped recess, the recess has a depth greater than the thickness of the light emitting layer; the area of the light emitting layer located in a range of the blocking structure is an area of the light emitting layer located on a bottom surface of the recess.

In an exemplary embodiment of the present disclosure, the blocking structure is a ring-shaped rib made of conductive material, an area where the second electrode layer is located on a surface of the rib away from the first electrode layer and an area where the second electrode layer is located in a range of the preset interval are interruptedly arranged, and the area where the second electrode layer is located in a range of the preset interval is in contact with an inner wall of the rib.

In an exemplary embodiment of the present disclosure, the forming a blocking structure surrounding the display area on a surface of the peripheral electrode away from the flexible substrate comprises:

forming a first conductive layer surrounding the display area on a surface of the peripheral electrode away from the flexible substrate; and forming a second conductive layer on a surface of the first conductive layer away from the flexible substrate, and the area where the second electrode layer is located in a range of the preset interval is in contact with an inner wall of the second conductive layer.

In an exemplary embodiment of the present disclosure, both the first conductive layer and the peripheral electrode are made of transparent conductive material and formed by one patterning process; and material of the second conductive layer is metal.

In an exemplary embodiment of the present disclosure, the forming a blocking structure surrounding the display area on a surface of the peripheral electrode away from the flexible substrate further comprises:

forming a protective layer on a surface of the second conductive layer away from the flexible substrate.

According to an aspect of the present disclosure, there is provided a display apparatus, comprising any one of the flexible display panels described above.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments that conform to the disclosure, and are used to explain the principle of the disclosure together with the specification. Understandably, the drawings in the following description are only some embodiments of the present disclosure. For those of ordinary skill in the art, other drawings can be obtained from these drawings without creative work.

DETAILED DESCRIPTION

Figure 1:
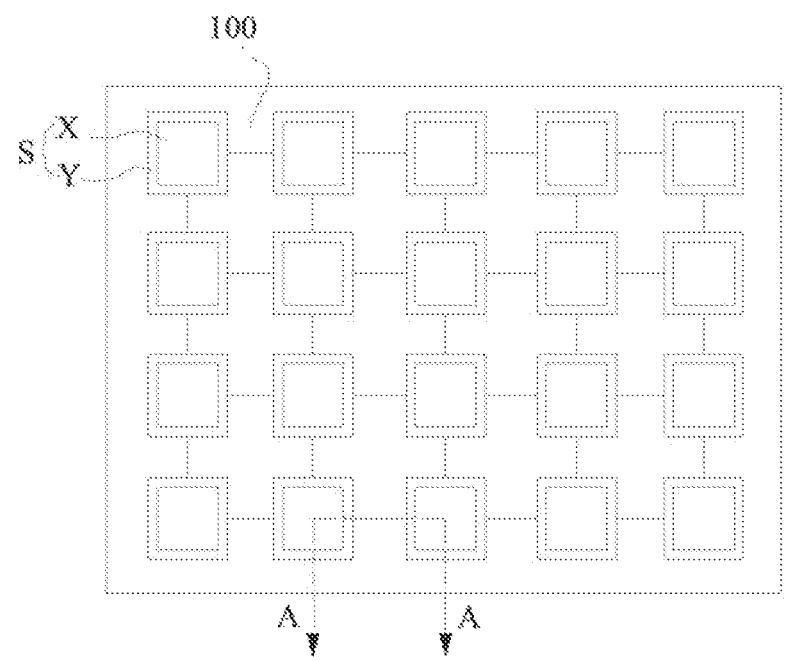
FIG. 1 is a top view of a first embodiment of a flexible display panel of the present disclosure.

Exemplary embodiments will now be described more fully with reference to the accompanying drawings. However, the exemplary embodiments can be implemented in various forms, and should not be construed as being limited to the embodiments set forth herein; on the contrary, these embodiments are provided so that this disclosure will be comprehensive and complete, and fully convey the concept of the exemplary embodiments to those skilled in the art.

The same reference numerals in the drawings represent the same or similar structures, and thus their detailed descriptions will be omitted. In addition, the drawings are only schematic illustrations of the present disclosure, and are not necessarily drawn to scale.

Although relative terms such as "upper" and "lower" are used in this specification to describe a relative relationship of one component of an icon with respect to another component of an icon, these terms are used in this specification only for convenience, for example, according to the direction of the example in the drawings. It can be understood that if the apparatus of the icon is turned upside down, the component described as "upper" will become the "lower" component. When a structure is "on" the other structure, it may mean that the structure is integrally formed on the other structure, or that the structure is "directly" arranged on the other structure, or that the structure is "indirectly" arranged on the other structure through another structure.

The terms "a", "an", "the" and "said" are used to indicate the presence of one or more elements/components/etc.; the terms "including" and "having" are used to indicate open-ended inclusion and mean that there may be other elements/components/etc. besides the listed elements/components/etc.; the terms "first", "second", etc. are only used as marks, not to limit the number of the objects.

The reference numerals used herein are as follows: 1. flexible substrate; S. pixel island; X. display area; Y. peripheral area; 2. driving layer; 21. active layer; 22. gate insulating layer; 23. gate electrode; 24. dielectric layer; 241. interlayer insulating layer; 242. interlayer dielectric layer; 25. source electrode; 26. drain electrode; 27. driving electrode; 28. flat layer; 3. first electrode layer; 31. first electrode; 32 peripheral electrode; 33. blocking structure; 331. first conductive layer; 332. second conductive layer; 333. protective layer; 4. light emitting layer; 5. second electrode layer; 6. pixel defining layer; 7. encapsulation layer; and 100. groove.

The embodiments of the present disclosure provide a flexible display panel, as shown in FIGS. 1 to 5. The flexible display panel is a stretchable flexible display panel, which may include a flexible substrate 1 and a plurality of pixel islands S. The pixel islands S are distributed on the flexible substrate 1 in an array. Each pixel island S has a display area X and a peripheral area Y, and the peripheral area Y surrounds the display area X. Each pixel island S includes a driving layer 2, a first electrode layer 3, a light emitting layer 4, and a second electrode layer 5 sequentially laminated in a direction away from the flexible substrate 1.

In the embodiment, the first electrode layer 3 includes a first electrode 31 located in the display area X and a peripheral electrode 32 located in the peripheral area Y, the peripheral electrode 32 surrounds the display area X, and a surface of the peripheral electrode 32 away from the flexible substrate 1 is provided with a ring-shaped blocking structure 33 surrounding the display area X, a preset interval exists between the blocking structure 33 and the display area X; and an area of the light emitting layer 4 directly opposite to the blocking structure 33 and an area of the light emitting layer 4 located in a range of the preset interval are interruptedly arranged. That is, the light emitting layer 4 is disconnected at an inner side of the blocking structure 33.

In the flexible display panel of the embodiment of the present disclosure, since the area of the light emitting layer 4 directly opposite to the blocking structure 33 is interruptedly arranged with the area of the light emitting layer 4 located in a range of the preset interval, an erosion path of water and oxygen is blocked, and erosion of the water and oxygen from the peripheral area Y to the display area X is prevented, and the display effect is guaranteed. At the same time, it can avoid adding openings on a mask to form a disconnected light emitting layer 4, thereby reducing the difficulty of designing and manufacturing the mask.

Each part of the flexible display panel of the embodiment of the present disclosure will be described in detail below.

As shown in FIGS. 2-5, the flexible substrate 1 can be of flexible transparent material, such as PET (polyethylene terephthalate), PI (polyimide), etc., so that the flexible substrate 1 can be stretched. Of course, it can also be bent. The shape and size of the flexible substrate 1 are not particularly limited. For example, the flexible substrate 1 may include a base, and a barrier layer and a buffer layer sequentially laminated on the flexible substrate 1. The flexible substrate 1 may also include only a base, or the flexible substrate 1 may include a base and one of the barrier layer and buffer layer.

As shown in FIGS. 1 to 5, a plurality of pixel islands S are arranged in an array on the flexible substrate 1, and adjacent pixel islands S are arranged at intervals. For example, each pixel island S can be separated by a plurality of crisscross grooves 100. Each pixel island S includes a driving layer 2, a first electrode layer 3, a light emitting layer 4, and a second electrode layer 5 sequentially laminated on the flexible substrate 1.

As for one pixel island S: the driving layer 2 is provided on one side of the flexible substrate 1, and the driving layer 2 may include a thin film transistor, which may be a top gate thin film transistor or a bottom gate thin film transistor, and used to drive the light emitting layer 4 to emit light. As shown in FIGS. 2-5, the top gate thin film transistor is taken as an example, the driving layer 2 includes an active layer 21, a gate insulating layer 22, a gate electrode 23, a dielectric layer 24, a source-drain layer and a driving electrode 27.

In the embodiment, the active layer 21 is located in the display area X, and its material may be polysilicon, amorphous silicon, etc., and the active layer 21 may include a channel region and two doped regions of different doping types located at two sides of the channel region.

The gate insulating layer 22 may cover the active layer 21, and the material of the gate insulating layer 22 is an insulating material, such as silicon oxide.

The gate electrode 23 is arranged on a surface of the gate insulating layer 22 away from the flexible substrate 1 and is directly opposite to the active layer 21. That is, a projection of the gate electrode 23 on the flexible substrate 1 is located within a projection range of the active layer 21 on the flexible substrate 1. For example, the projection of the gate electrode 23 on the flexible substrate 1 coincides with a projection of the channel region of the active layer 21 on the flexible substrate 1.

The dielectric layer 24 covers the gate electrode 23 and the gate insulating layer 22. For example, the dielectric layer 24 may include an interlayer insulating layer 241 and an interlayer dielectric layer 242 that are sequentially laminated in a direction away from the flexible substrate. Both the interlayer insulating layer 241 and the interlayer dielectric layer 242 are of insulating material, but the material of the them two can be different. The dielectric layer 24 may also have a single-layer structure.

The source-drain layer is provided on a surface of the dielectric layer 24 away from the gate layer, and the source-drain layer includes a source electrode 25 and a drain electrode 26. The source electrode 25 and the drain electrode 26 are directly opposite to the active layer 21 and connected to the active layer 21. For example, the source electrode 25 and the drain electrode 26 are respectively connected to the two doped regions of the corresponding active layer 21 through via holes. At the same time, the drain electrode 26 is connected to the first electrode 31 through a via hole.

The driving electrode 27 is provided on a surface of the dielectric layer 24 away from the gate electrode 23 and located in the peripheral area Y, and the driving electrode 27 is connected to the peripheral electrode 32 in the peripheral area Y. Further, the source-drain layer and the driving electrode 27 are of the same material, which is convenient to be formed by one patterning process.

In addition, the above-mentioned driving layer 2 may further include a flat layer 28. The flat layer 28 may be of insulating material and cover the dielectric layer 24, the source-drain layer and the driving electrode 27. The surface of the flat layer 28 away from the flexible substrate 1 is a plane surface, and the plane surface is the surface of the driving layer 2 away from the flexible substrate 1.

As shown in FIGS. 2 to 5, the first electrode layer 3 is provided on a surface of the driving layer 2 away from the flexible substrate 1. For example, the first electrode layer 3 is provided on a surface of the flat layer 28 away from the flexible substrate 1. The first electrode layer 3 includes a first electrode 31 and a peripheral electrode 32.

In the embodiment, the first electrode 31 is located in the display area X and is connected to the source-drain layer of the driving layer 2. For example, the first electrode 31 is connected to the drain electrode 26 through a first via hole in the flat layer 28. The peripheral electrode 32 is located in the peripheral area Y surrounding the display area X, the peripheral electrode 32 surrounds the first electrode 31, and the peripheral electrode 32 is connected to the driving electrode 27. For example, the peripheral electrode 32 is connected to the driving electrode 27 through the second via hole in the flat layer 28.

The surface of the peripheral electrode 32 away from the flexible substrate 1 is provided with a ring-shaped blocking structure 33 surrounding the display area X, and there is a preset interval between the blocking structure 33 and the display area X. The preset interval is a distance between the blocking structure 33 and a position on an edge of the display area X close to the blocking structure 33. The preset interval is greater than 0, so that the blocking structure 33 and the display area X are not directly connected, but separated by an area of the peripheral electrode 32 within the preset interval range.

The blocking structure 33 may be a rib or a recess provided at the peripheral electrode 32. When the light emitting layer 4 is formed, the light emitting layer 4 is disconnected at the inner wall of the rib or the side wall of the recess, so that the light emitting layer 4 is disconnected at an inner side of the blocking structure 33.

Figure 2:
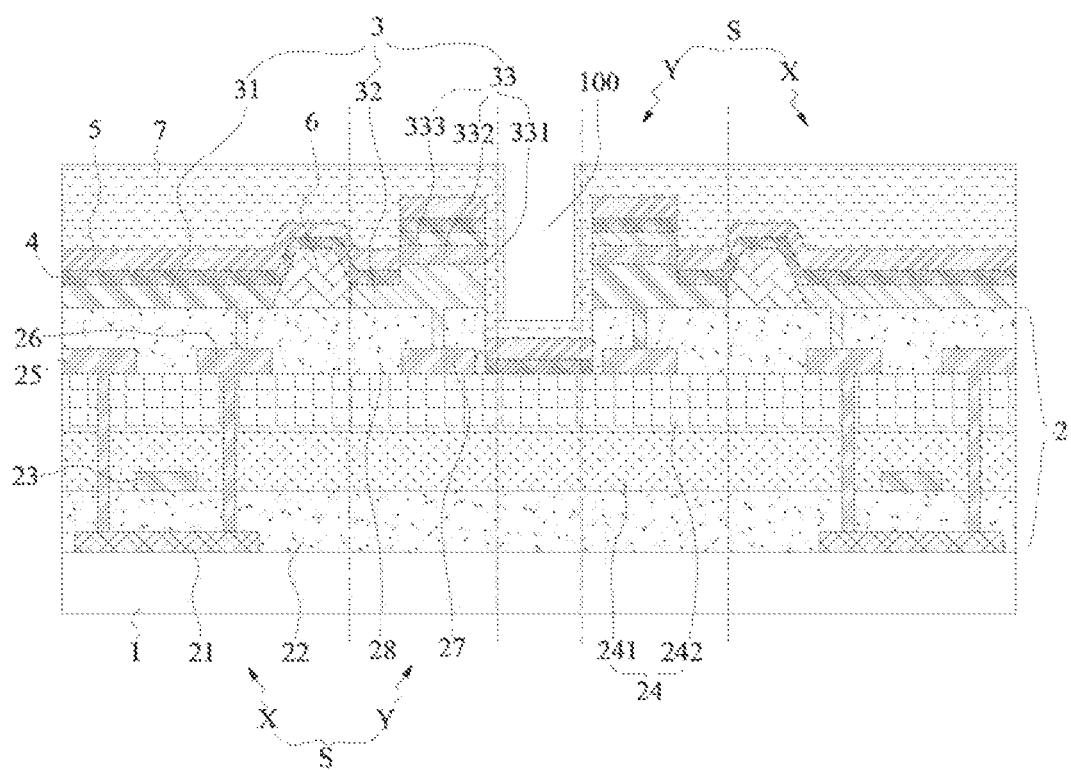
FIG. 2 is a cross-sectional view along A-A of the flexible display panel in FIG. 1.

In the first embodiment of the flexible display panel of the present disclosure, as shown in FIG. 2, the blocking structure 33 may be a rib raised in a direction away from the flexible substrate 1. The rib may be a continuous or discontinuous ring-shaped structure, and a shape of the radial cross section can be rectangular, trapezoidal, etc., and the radial cross section is a cross section perpendicular to the flexible substrate 1. The height of the rib is greater than the thickness of the light emitting layer 4; the area of the light emitting layer directly opposite to the blocking structure 33 is an area where the light emitting layer 4 is located on a surface of the rib away from the first electrode layer 3.

The inner wall of the rib has a certain slope on the surface of the first electrode layer 3 away from the flexible substrate 1. The height of the rib may be greater than the thickness of the light emitting layer 4, so that the light emitting layer 4 can be disconnected at the inner wall of the rib, and the light emitting layer 4 is disconnected within the range of the preset interval. For example, an angle between the radial cross section of the inner wall of the rib and the surface of the first electrode layer 3 away from the flexible substrate 1 is not less than 90° and not more than 100°. At the same time, the thickness of the light emitting layer 4 is less than 1 μm, and the height of the rib can be greater than 1 μm, which further ensures that the light emitting layer 4 is disconnected at the inner wall of the rib.

The ribs can be of conductive or insulating material, and the rib can be a single layer structure or a multilayer structure laminated in a direction away from the flexible substrate 1. For example, as shown in FIG. 2, the rib can be of conductive material and include a first conductive layer 331 and a second conductive layer 332.

In the embodiment, the first conductive layer 331 is provided on a surface of the peripheral electrode 32 away from the flexible substrate 1. In order to simplify the process, both the first conductive layer 331 and the peripheral electrode 32 are made of transparent conductive material, such as ITO, and the first conductive layer 331 and the periphery electrode 32 may be an integrated structure, so that they may be formed by one patterning process.

Of course, the first conductive layer 331 may also be of conductive material different from the first electrode layer 3.

The second conductive layer 332 covers the surface of the first conductive layer 331 away from the flexible substrate 1, and may be of conductive material, such as metal. The second conductive layer 332 can be of metal material. When the first conductive layer 331 and the peripheral electrode 32 are an integrated structure of transparent conductive material, since the film-forming thickness of the transparent conductive material is limited, the use of a metal material for the second conductive layer 332 can further increase the height of the rib, which is beneficial to ensure that the light emitting layer 4 is disconnected at the inner wall of the rib.

Further, as shown in FIG. 2, the rib may also include a protective layer 333. The protective layer 333 may cover the surface of the second conductive layer 332 away from the flexible substrate 1. The material of the protective layer 333 may be conductive or insulating material, to protect the second conductive layer 332. For example, both the protective layer 333 and the first conductive layer 331 may use the transparent conductive material, such as ITO.

Figure 3:
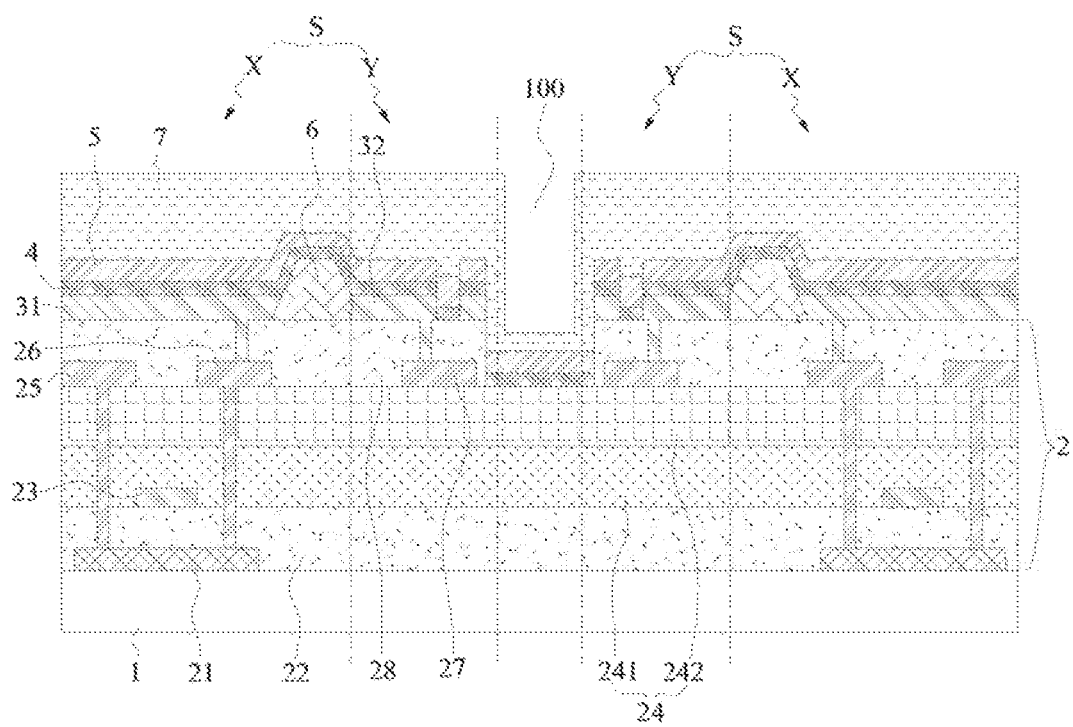
FIG. 3 is a cross-sectional view of a second embodiment of a flexible display panel of the present disclosure.
Figure 4:
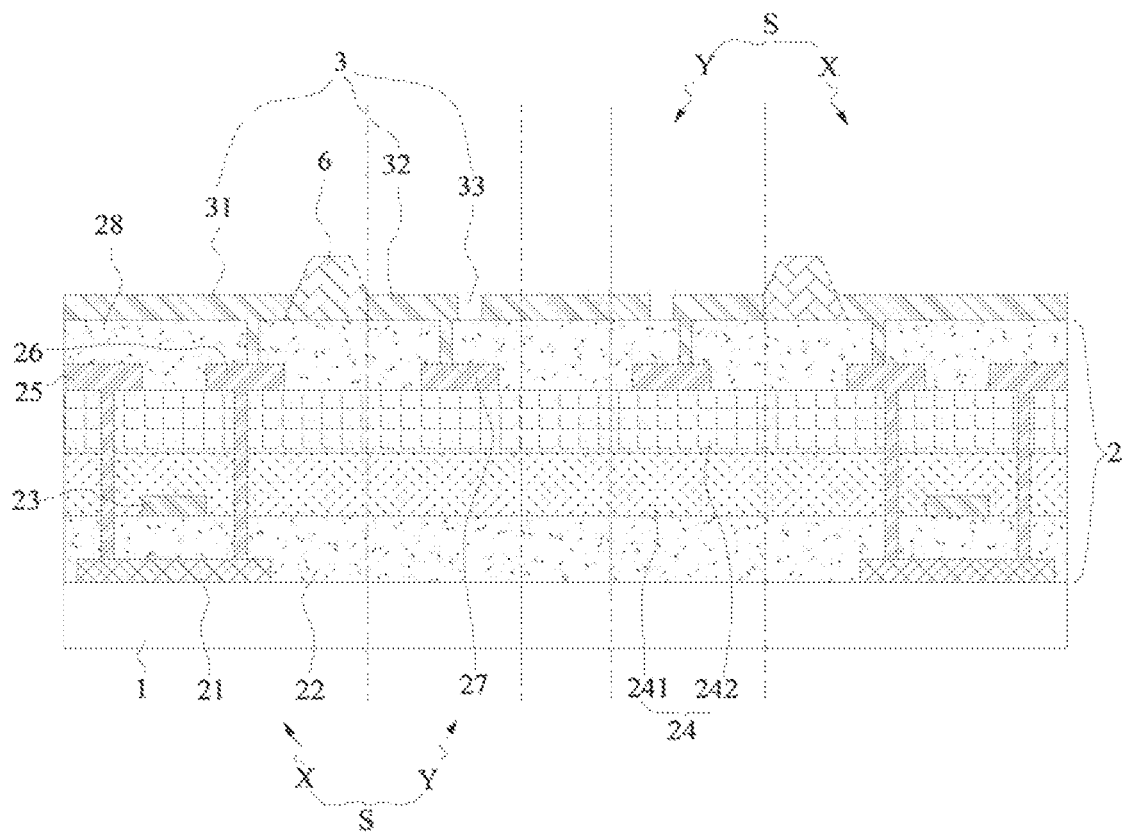
FIG. 4 is a cross-sectional view of the flexible display panel before forming the light emitting layer in the second embodiment of the present disclosure.

In the second embodiment of the flexible display panel of the present disclosure, as shown in FIGS. 3 and 4, the blocking structure 33 is a recess recessed toward the flexible substrate 1. The recess surrounds the display area X, and the depth of the recess may be greater than the thickness of the light emitting layer 4. The area of the light emitting layer 4 directly opposite to the blocking structure 33 is the area where the light emitting layer 4 is located on the bottom surface of the recess, so that the light emitting layer 4 can be disconnected at the side wall of the recess, and the light emitting layer 4 is disconnected at the side wall of the recess. The peripheral electrode 32 is recessed in the recess, but the part inside the recess is connected to the part outside the recess, so as to ensure a smooth circuit.

Each pixel island S may include a plurality of pixels. In order to define each pixel, as shown in FIGS. 1 to 5, the pixel island S further includes a pixel defining layer 6, which is provided in the display area X and has a plurality of hollowed-out pixel areas to define a plurality of pixels, and each pixel is within a range surrounded by the blocking structure 33.

The light emitting layer 4 can cover the surface of the first electrode layer 3 away from the flexible substrate 1, and an area of the light emitting layer directly opposite to the blocking structure 33 and an area of the light emitting layer located in a range of the preset interval are interruptedly arranged. Taking the blocking structure 33 as the rib described above as an example, as shown in FIG. 2, the thickness of the light emitting layer 4 is less than the height of the rib. Therefore, due to the existence of the rib, when the light emitting layer 4 is formed, the light emitting layer 4 cannot cover the inner wall of the rib, while the light emitting layer 4 is disconnected at the inner wall of the rib, that is, it is disconnected at an inner side of the blocking structure 33, which blocks the erosion path of water and oxygen.

The light emitting layer 4 may include electro-organic light emitting material, which may be formed by processes such as evaporation. For example, the light emitting layer 4 may include a hole injection layer, a hole transport layer, an organic light emitting layer, an electron transport layer, and an electron injection layer sequentially laminated on the first electrode layer 3. The specific light emitting principle will not be described in detail herein.

Figure 5:
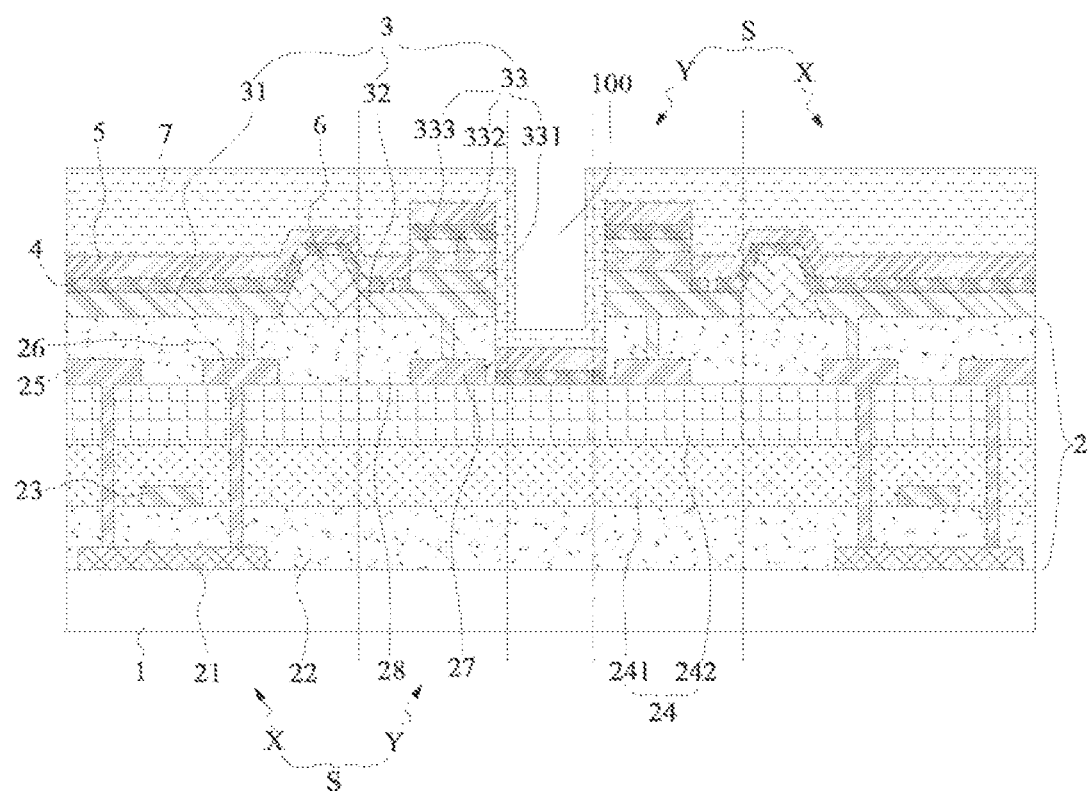
FIG. 5 is a cross-sectional view of a third embodiment of a flexible display panel of the present disclosure.

The second electrode layer 5 can cover the surface of the light emitting layer 4 away from the flexible substrate 1, and the second electrode layer 5 is connected to the peripheral electrode 32. In one embodiment, as shown in FIG. 2, the blocking structure 33 is the rib described above. The area of the second electrode layer 5 located within the preset interval range is in contact with the second conductive layer 332 of the rib, thereby contacting the inner wall of the rib. Of course, as shown in FIG. 5, in the third embodiment of the flexible display panel of the present disclosure, if the rib 33 is made of insulating material, the second electrode layer 5 can also extend to the peripheral area Y and connect to the peripheral electrode 32 through the via hole. The via hole is located within the range of the preset interval, and is located at the side of the discontinuous area of the light emitting layer 4 close to the display area X.

The second electrode layer 5 can be used as a cathode, the first electrode 31 of the first electrode layer 3 can be used as an anode, and the light emitting layer 4 can be driven to emit light by applying a signal to the first electrode 31.

When each pixel island S is formed, the first electrode layer 3 of each pixel island S is a conductive layer formed by one patterning process, and a plurality of grooves 100 may be provided in the conductive layer, and the groove 100 is recessed into the driving layer 2. For example, the groove 100 is recessed to expose the dielectric layer 24 in the depth direction. Of course, the depth of the groove 100 can also be greater, for example, to expose the flexible substrate 1. Each groove 100 may be distributed in a crisscross pattern, thereby dividing into a plurality of pixel islands S.

As shown in FIGS. 2 to 5, the groove 100 can be set after the blocking structure 33 is formed and before the light emitting layer 4 is formed. Therefore, after the light emitting layer 4 and the second electrode layer 5 are formed, the light emitting layer 4 and the second electrode layer 5 can be laminated on the bottom surface of the groove 100.

In addition, as shown in FIGS. 2-5, the flexible display panel of the embodiment of the present disclosure may further include an encapsulation layer 7. The encapsulation layer 7 simultaneously covers the surface of the second electrode layer 5 of each pixel island S away from the flexible substrate 1 and extends into the groove 100 and covers the inner surface of the groove 100, so that the encapsulation layer 7 plays a role of isolation and protection.

In addition, since the area of the light emitting layer 4 located in a range of the preset interval and the area of the light emitting layer 4 directly opposite to the blocking structure 33 are interruptedly arranged, which has blocked the erosion path of water and oxygen, the display effect can still be guaranteed even if the encapsulation layer 7 in the groove 100 is broken due to stretching. The encapsulation layer 7 can be a single layer or multilayer structure, which is not specifically limited herein.

The embodiments of the present disclosure further provide a method for manufacturing a flexible display panel. The flexible display panel includes a flexible substrate and a plurality of pixel islands arranged in an array on the flexible substrate. Each pixel island has a display area and a peripheral area surrounding the display area. The specific structure of the flexible display panel can refer to the flexible display panel of any of the above embodiments.

Figure 6:
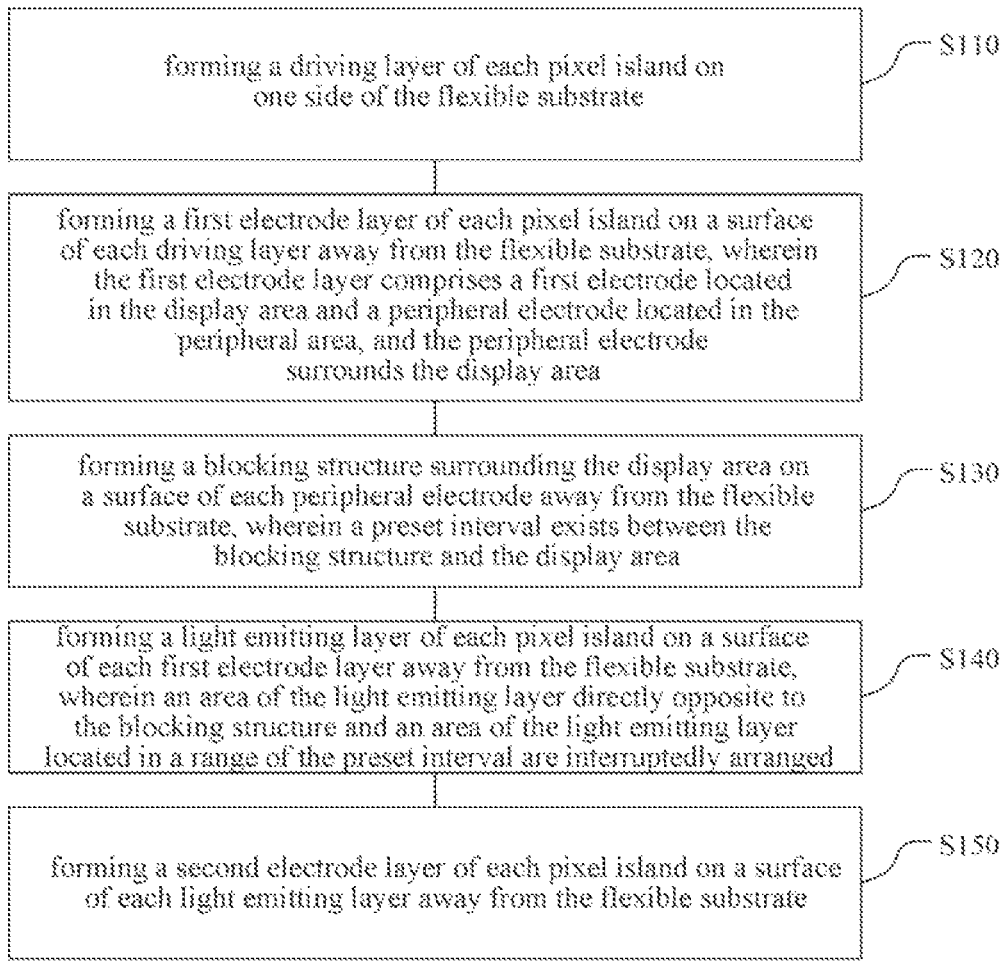
FIG. 6 is a flowchart of an embodiment of the manufacturing method of the present disclosure.

As shown in FIG. 6, the manufacturing method of the embodiment of the present disclosure includes:

step S110, forming a driving layer of each pixel island on one side of the flexible substrate;

step S120, forming a first electrode layer of each pixel island on a surface of each driving layer away from the flexible substrate, wherein the first electrode layer includes a first electrode located in the display area and a peripheral electrode located in the peripheral area, and the peripheral electrode surrounds the display area;

step S130, forming a blocking structure surrounding the display area on a surface of each peripheral electrode away from the flexible substrate, wherein a preset interval exists between the blocking structure and the display area;

step S140, forming a light emitting layer of each pixel island on a surface of each first electrode layer away from the flexible substrate, wherein an area of the light emitting layer directly opposite to the blocking structure and an area of the light emitting layer located in a range of the preset interval are interruptedly arranged; and step S150, forming a second electrode layer of each pixel island on a surface of each light emitting layer away from the flexible substrate.

In the manufacturing method of the embodiment of the present disclosure, as shown in FIGS. 1 to 5, since the area of the light emitting layer 4 directly opposite to the blocking structure 33 is interruptedly arranged with the area of the light emitting layer 4 located in a range of the preset interval, that is, the light emitting layer 4 is disconnected at an inner side of the blocking structure 33, an erosion path of water and oxygen is blocked, and erosion of the water and oxygen from the peripheral area Y to the display area X is prevented, and the display effect is guaranteed. At the same time, it can avoid adding openings on a mask to form a disconnected light emitting layer 4, thereby reducing the difficulty of designing and manufacturing the mask.

The steps of the manufacturing method of the embodiment of the present disclosure are described in detail below.

In step S110, a driving layer of each pixel island is formed on one side of the flexible substrate.

Figure 8:
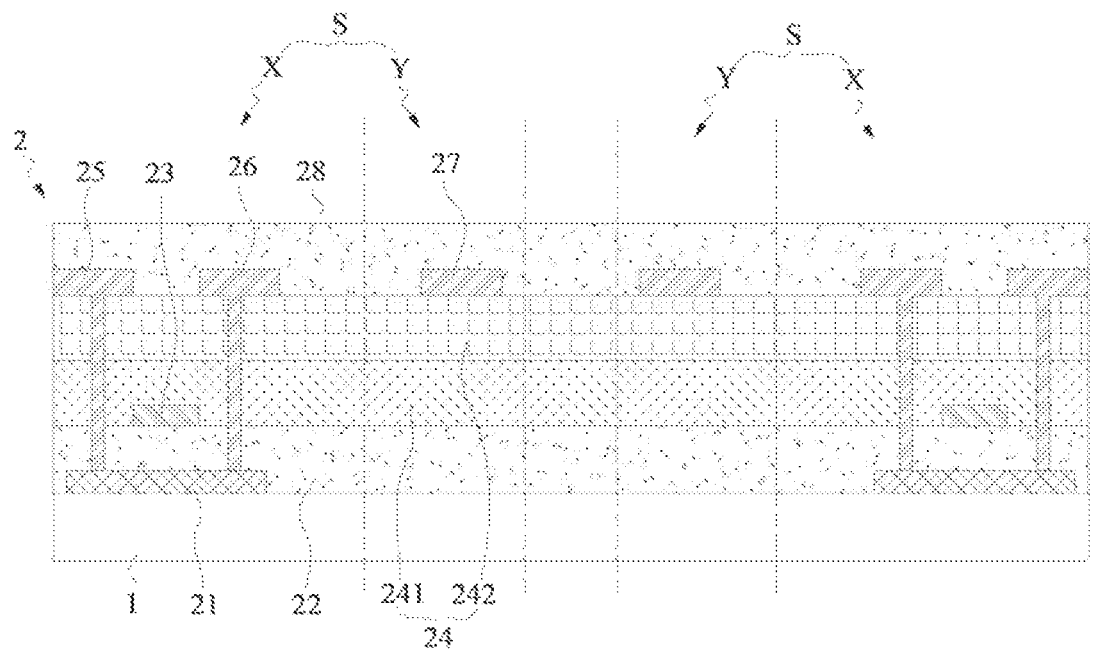
FIG. 8 is a schematic diagram after step S120 is completed in an embodiment of the manufacturing method of the present disclosure.

As shown in FIGS. 2 and 8, the flexible substrate 1 can be of flexible transparent material, such as PET (polyethylene terephthalate), PI (polyimide), etc., so that the flexible substrate 1 can be stretched. Of course, it can also be bent. The shape and size of the flexible substrate 1 are not particularly limited. For example, the flexible substrate 1 may include a base, and a barrier layer and a buffer layer sequentially laminated on the flexible substrate 1. The flexible substrate 1 may also include only a base, or the flexible substrate 1 may include a base and one of the barrier layer and buffer layer.

As shown in FIGS. 2 and 8, the driving layer 2 may include a thin film transistor, which may be a top gate thin film transistor or a bottom gate thin film transistor, and the thin film transistor is used to drive the light emitting layer 4 to emit light. The top gate thin film transistor is taken as an example, the driving layer 2 includes an active layer 21, a gate insulating layer 22, a gate electrode 23, a dielectric layer 24, a source-drain layer and a driving electrode 27. The step S110 of forming a driving layer 2 of each pixel island S on one side of the flexible substrate 1 includes step S1110-step S1160, where:

step S1110, forming an active layer of each pixel island on one side of the flexible substrate;

step S1120, forming a gate insulating layer covering each active layer;

step S1130, forming a gate electrode of each pixel island on a surface of the gate insulating layer away from the flexible substrate;

step S1140, forming a dielectric layer covering each gate electrode and the gate insulating layer;

step S1150, forming a source-drain layer of each pixel island on a surface of the dielectric layer away from the gate electrode, wherein the source-drain layer includes a source electrode and a drain electrode connected to the active layer, and the drain electrode is connected to the first electrode through a via hole; and step S1160, forming a driving electrode on a surface of the dielectric layer away from the gate electrode, wherein the driving electrode is located in the peripheral area and connected to the peripheral electrode.

As shown in FIGS. 2-5 and 8, details of the structure of the flexible substrate 1 and the driving layer 2 have been described in the implementation of the flexible display panel described above, which will not be repeated herein.

In step S120, a first electrode layer of each pixel island is formed on the surface of each driving layer away from the flexible substrate. The first electrode layer includes a first electrode located in the display area and the peripheral electrode located in the peripheral area. The peripheral electrode surrounds the display area.

Figure 9:
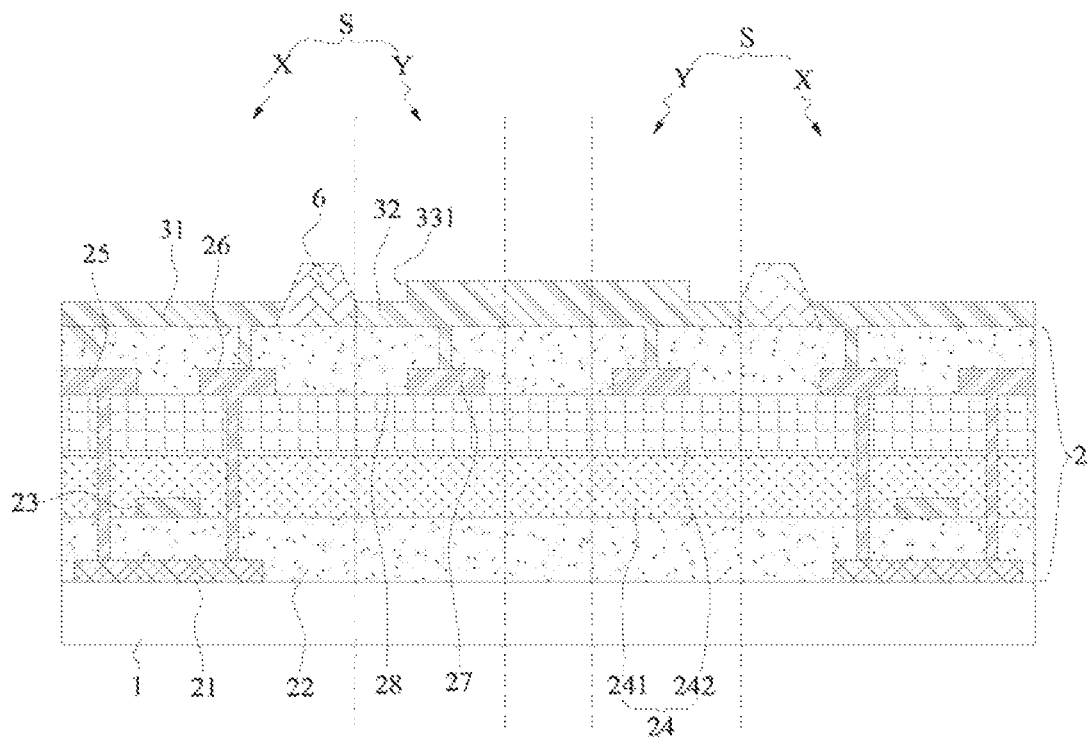
FIG. 9 is a schematic diagram after step S1310 is completed in an embodiment of the manufacturing method of the present disclosure.

As shown in FIG. 9, the first electrode layer 3 can be formed on the surface of the flexible substrate 1 through a masking process. For example, an electrode metal layer can be deposited on the surface of the flexible substrate 1, and the electrode metal layer can be patterned through the masking process, to obtain the first electrode layer 3. The structure of the first electrode layer 3 can refer to the first electrode layer 3 in the above implementation of the flexible display panel, which will not be repeated herein.

In step S130, a blocking structure surrounding the display area is formed on a surface of each peripheral electrode away from the flexible substrate, and a preset interval exists between the blocking structure and the display area.

Figure 7:
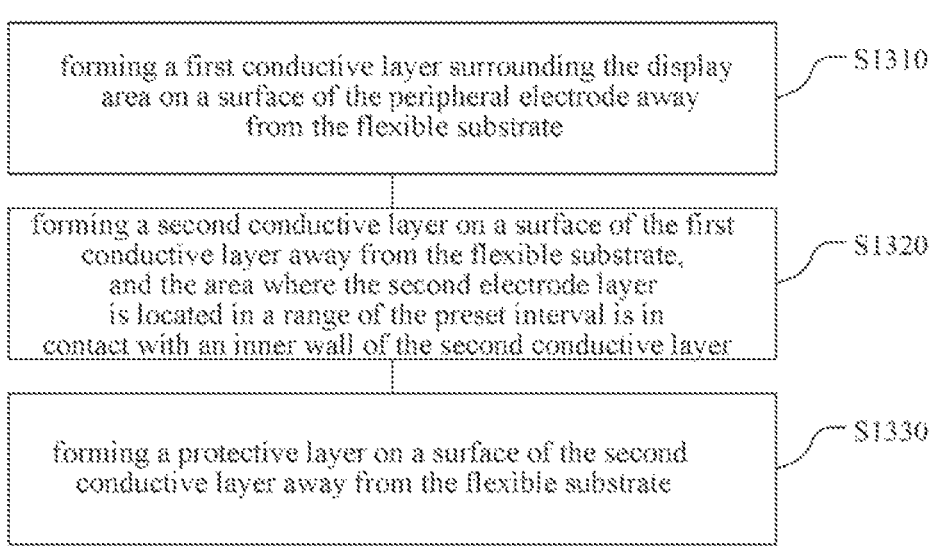
FIG. 7 is a flowchart of step S130 in an embodiment of the manufacturing method of the present disclosure.

As shown in FIGS. 2-5, the blocking structure 33 may be a ring-shaped rib or recess provided at the peripheral electrode 32. When the light emitting layer 4 is formed, the light emitting layer 4 is disconnected at the inner wall of the rib or the inner wall of the recess, such that the light emitting layer 4 is disconnected at an inner side of the blocking structure 33. In one embodiment, as shown in FIG. 2, the blocking structure 33 is a rib of conductive material, and the rib may be a single layer structure or a multilayer structure laminated in a direction away from the flexible substrate 1. As shown in FIG. 7, step S130 includes step S1310 and step S1320.

Step S1310, a first conductive layer surrounding the display area is formed on a surface of the peripheral electrode away from the flexible substrate.

As shown in FIG. 9, the first conductive layer 331 is provided on the surface of the peripheral electrode 32 away from the flexible substrate 1, and in order to simplify the process, the first conductive layer 331 and the peripheral electrode 32 are made of the same transparent conductive material. The first conductive layer 311 can be obtained by etching a partial area of the peripheral electrode 32, and the un-etched area of the peripheral electrode 32 is the first conductive layer 331. Of course, the first conductive layer 331 may also be of conductive material different from the peripheral electrode 32.

Step S1320, a second conductive layer is formed on a surface of the first conductive layer away from the flexible substrate, and the area where the second electrode layer is located in a range of the preset interval is in contact with an inner wall of the second conductive layer.

Figure 10:
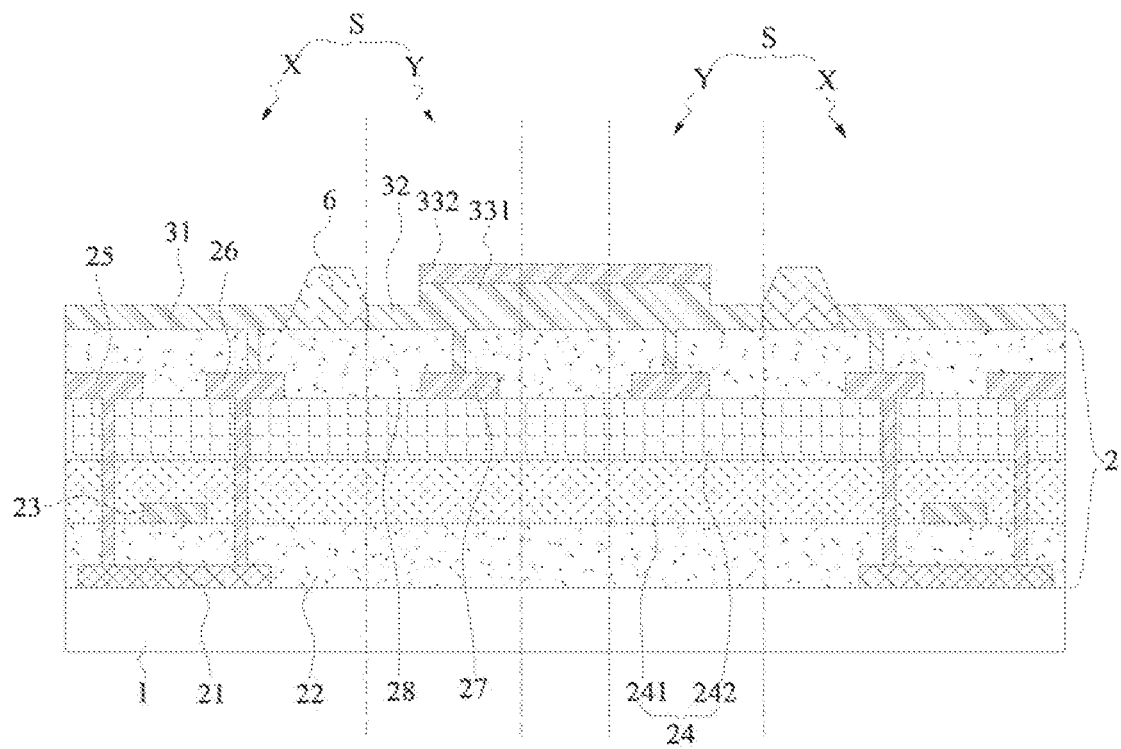
FIG. 10 is a schematic diagram after step S1320 is completed in an embodiment of the manufacturing method of the present disclosure.

As shown in FIG. 10, the second conductive layer 332 covers the surface of the first conductive layer 331 away from the flexible substrate 1, and it may be of conductive material, such as metal. The second conductive layer 332 may be of metal material. When the first conductive layer 331 and the peripheral electrode 32 are an integrated structure of transparent conductive material, since the film-forming thickness of the transparent conductive material is limited, the use of the metal material for the second conductive layer 332 can further increase the height of the rib, which helps to ensure that the light emitting layer 4 is disconnected at the inner wall of the rib.

In addition, as shown in FIG. 7, step S130 may further include:

step S1330, forming a protective layer on a surface of the second conductive layer away from the flexible substrate.

Figure 11:
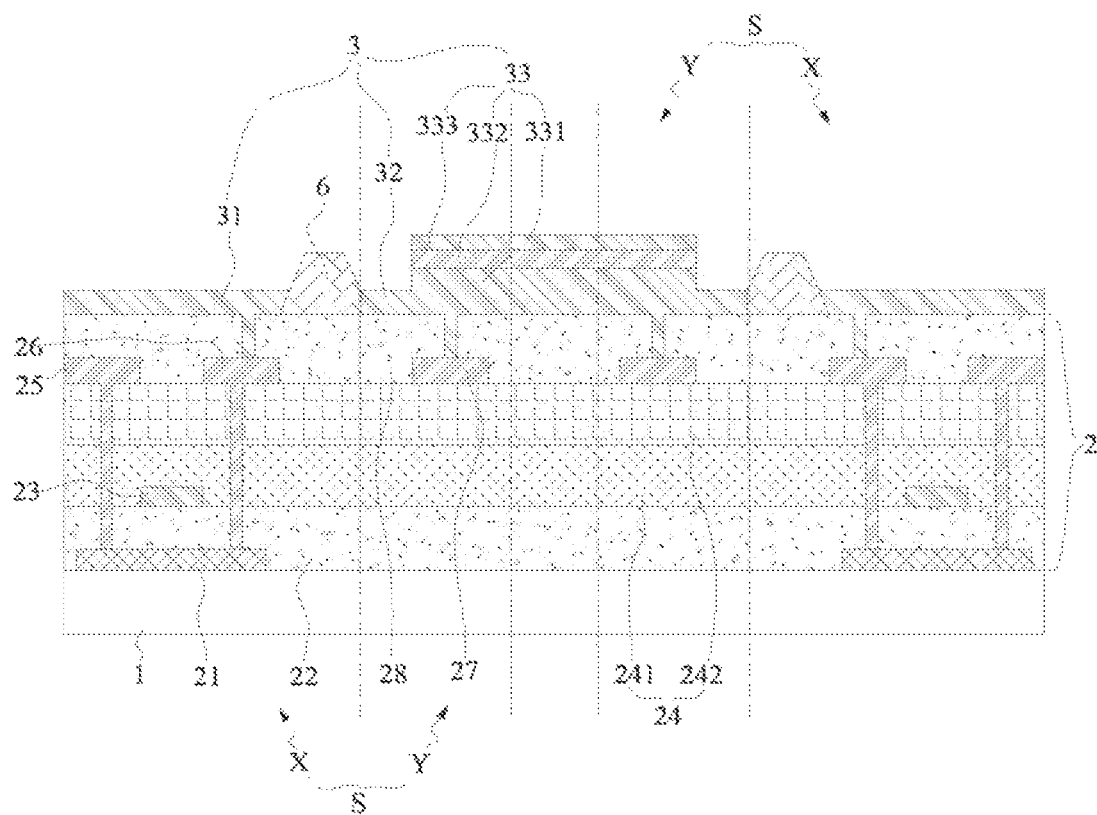
FIG. 11 is a schematic diagram after step S1330 is completed in an embodiment of the manufacturing method of the present disclosure.

As shown in FIG. 11, the material of the protective layer 333 may be conductive or insulating material, to protect the second conductive layer 332. For example, both the protective layer 333 and the first conductive layer 331 may use the transparent conductive material, such as ITO.

Step S140, a light emitting layer of each pixel island is formed on a surface of each first electrode layer away from the flexible substrate, wherein an area of the light emitting layer directly opposite to the blocking structure and an area of the light emitting layer located in a range of the preset interval are interruptedly arranged.

Figure 13:
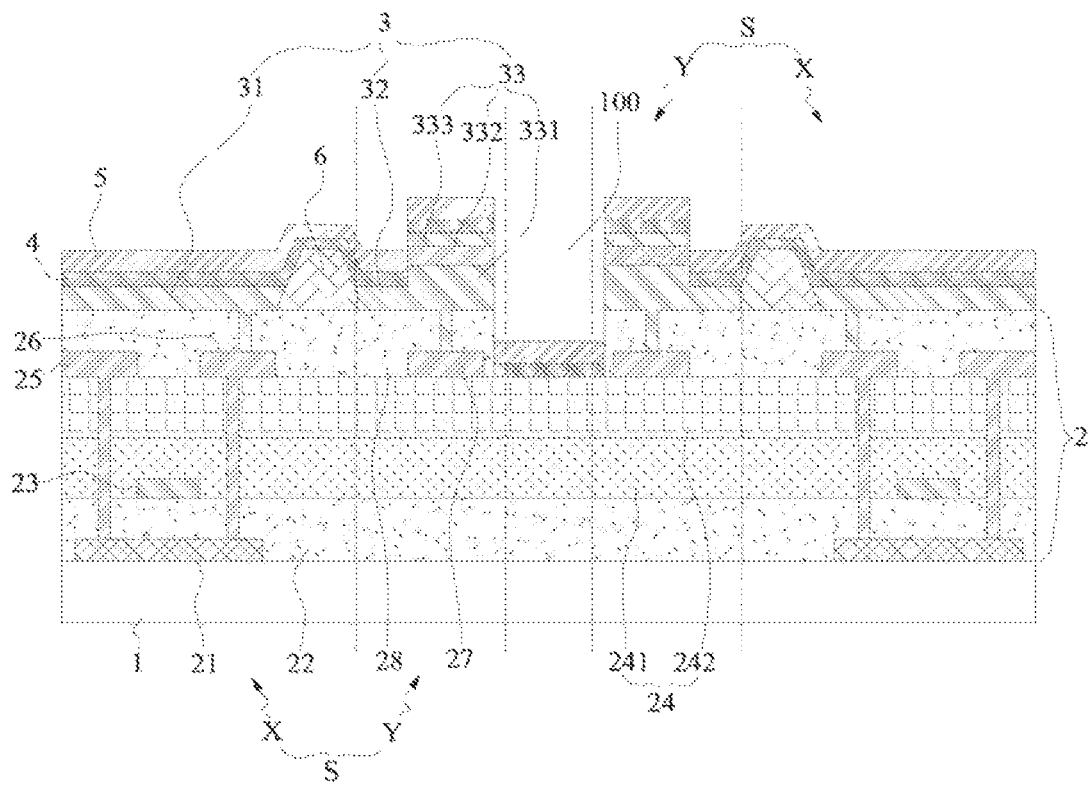
FIG. 13 is a schematic diagram after step S150 is completed in an embodiment of the manufacturing method of the present disclosure.

As shown in FIG. 13, the light emitting layer 4 may include electro-organic light emitting material, which may be formed by processes such as vapor deposition. During the formation process, due to the existence of the blocking structure 33, the light emitting layer 4 can be disconnected within a preset interval range, thereby blocking the erosion path of water and oxygen. For example, the blocking structure 33 is the rib or recess described above, so that there is a height difference on the peripheral electrode 32, and the light emitting layer 4 is disconnected since it cannot be formed at the inner wall of the rib or the side wall of the recess.

Step S150, a second electrode layer of each pixel island is formed on a surface of each light emitting layer away from the flexible substrate.

As shown in FIG. 13, the second electrode layer 5 can cover the surface of the light emitting layer 4 away from the flexible substrate 1, and the second electrode layer 5 is connected to the peripheral electrode 32. For example, an area of the second electrode layer 5 located within the above preset interval range is in contact with the second conductive layer 332 of the rib, that is, in contact with the inner wall of the rib, so as to be connected to the peripheral electrode 32. Of course, as shown in FIG. 5, if the rib is of insulating material, the second electrode layer 5 can also extend to the peripheral area Y and be connected to the peripheral electrode 32 through a via hole. The via hole is located in the range of a preset interval and it is located at the side of the discontinuous area of the light emitting layer 4 close to the display area X.

The second electrode layer 5 can be used as a cathode, the first electrode 31 of the first electrode layer 3 can be used as an anode, and the light emitting layer 4 can be driven to emit light by applying a signal to the first electrode 31.

After step S130 and before step S140, the manufacturing method of the embodiment of the present disclosure may further include:

step S160, providing a plurality of grooves recessed into the driving layer in the first electrode layer, to divide into a plurality of pixel islands.

Figure 12:
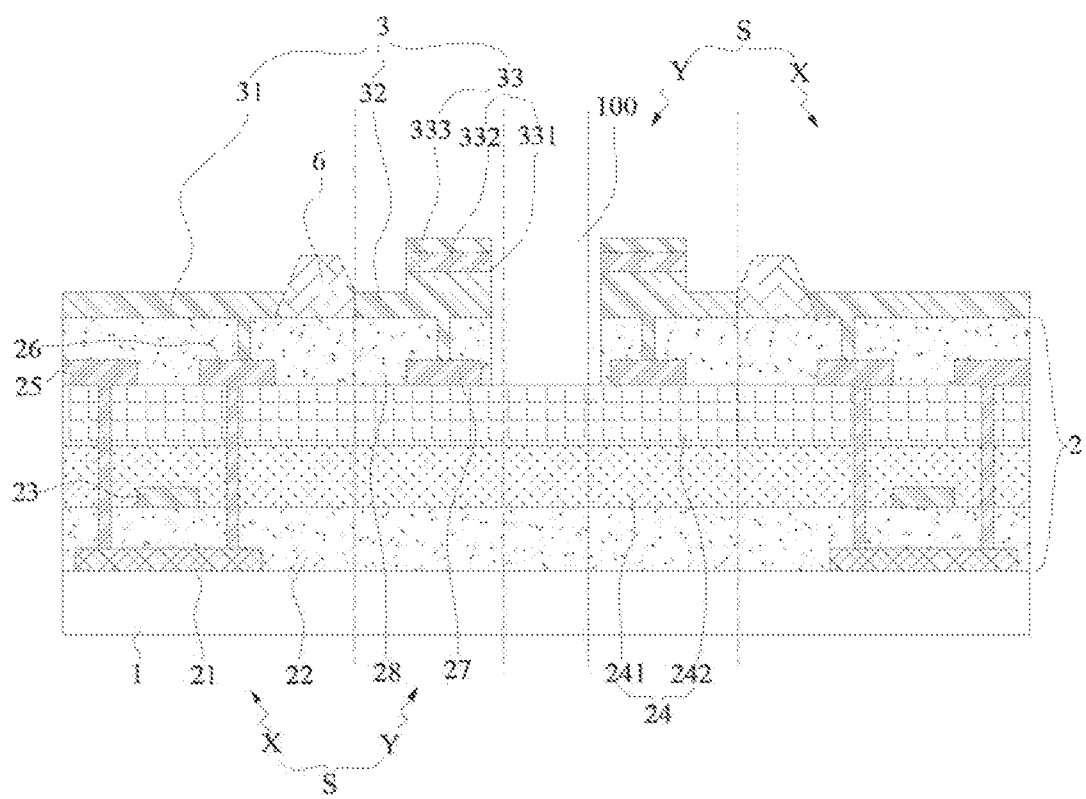
FIG. 12 is a schematic diagram after step S160 is completed in an embodiment of the manufacturing method of the present disclosure.

As shown in FIG. 12, the groove 100 can be formed by a wet or dry etching process, and the groove 100 is recessed into the driving layer 2. For example, the groove 100 is recessed to expose the dielectric layer 24 along the depth direction. Of course, the depth of the groove 100 can also be greater, for example, to expose the flexible substrate 1. Each groove 100 may be distributed in a crisscross pattern, thereby dividing into a plurality of pixel islands S.

The groove 100 can be set after the blocking structure 33 is formed and before the light emitting layer 4 is formed. Therefore, after the light emitting layer 4 and the second electrode layer 5 of each pixel island S are formed, the light emitting layer 4 and the second electrode layer 5 can be laminated on the bottom surface of the groove 100.

In order to define each pixel, after step S130 and before step S140, the manufacturing method of the embodiment of the present disclosure may further include:

step S170, forming a pixel defining layer of each pixel island on the surface of each first electrode away from the flexible substrate, wherein the pixel defining layer has a plurality of hollowed-out pixel regions.

Step S170 can be performed before step S160.

The manufacturing method of the embodiment of the present disclosure may further include:

step S180, forming an encapsulation layer on the surface of each second electrode layer away from the flexible substrate.

As shown in FIGS. 2-5, the encapsulation layer 7 covers the surface of the second electrode layer 5 away from the flexible substrate 1 and extends into the groove 100 and covers the inner surface of the groove 100, so that the encapsulation layer 7 plays a role of isolation and protection. In addition, since the light emitting layer 4 is interruptedly arranged within the preset interval range, which has blocked the erosion path of water and oxygen, the display effect can still be guaranteed even if the encapsulation layer 7 in the groove 100 is broken due to stretching. The encapsulation layer 7 can be a single layer or multilayer structure, which is not specifically limited herein.

In addition, although various steps of the method of the present disclosure are described in a specific order in the drawings, this does not require or imply that these steps must be performed in the specific order, or that all the steps shown must be performed to achieve the desired result. Additionally or alternatively, some steps may be omitted, multiple steps may be combined into one step for execution, and/or one step may be decomposed into multiple steps for execution, or the like.

The embodiments of the present disclosure also provide a display apparatus, which may include the flexible display panel of any of the foregoing embodiments. The display apparatus can be used in electronic devices such as mobile phones, watches, tablet computers, etc., which will not be listed herein. At the same time, the beneficial effects of the display apparatus can be referred to the beneficial effects of the flexible display panel in the above-mentioned embodiments, which will not be detailed herein.

In the display apparatus, the flexible display panel and the manufacturing method thereof of the present disclosure, since the surface of the peripheral electrode of each pixel island away from the flexible substrate is provided with a blocking structure surrounding the display area, there is a preset interval between the blocking structure and the display area, an area of the light emitting layer directly opposite to the blocking structure and an area of the light emitting layer located in a range of the preset interval are interruptedly arranged, that is, the light emitting layer is disconnected at an inner side of the blocking structure, thereby the erosion path of water and oxygen is blocked, water and oxygen is prevented from eroding from the peripheral area to the display area, which is beneficial to ensure the display effect. At the same time, it can avoid adding openings on the mask to form a disconnected light emitting layer, thereby reducing the design and manufacturing difficulty of the mask.

Those skilled in the art will easily think of other embodiments of the present disclosure after considering the description and practicing the disclosure disclosed herein. This application is intended to cover any variations, uses, or adaptive changes of the present disclosure. These variations, uses, or adaptive changes follow the general principles of the present disclosure and include common knowledge or conventional technical means in the technical field not disclosed in the present disclosure. The description and the embodiments are only regarded as exemplary, and the true scope and spirit of the present disclosure are pointed out by the appended claims.

What is claimed is:

1. A flexible display panel, comprising:
    a flexible substrate and a plurality of pixel islands arranged in an array on the flexible substrate, wherein the pixel island has a display area and a peripheral area surrounding the display area, and each of the pixel islands comprises a driving layer, a first electrode layer, a light emitting layer, and a second electrode layer sequentially laminated on the flexible substrate,
    wherein the first electrode layer comprises a first electrode located in the display area and a peripheral electrode located in the peripheral area, the peripheral electrode surrounds the display area, and a surface of the peripheral electrode away from the flexible substrate is provided with a blocking structure surrounding the display area, a preset interval exists between the blocking structure and the display area; and an area of the light emitting layer located in a range of the blocking structure and an area of the light emitting layer located in a range of the preset interval are interruptedly arranged.

2. The flexible display panel according to claim 1, wherein:
    the blocking structure is a ring-shaped rib, the rib has a height greater than a thickness of the light emitting layer, and the area of the light emitting layer located in a range of the blocking structure is an area where the light emitting layer is located on a surface of the rib away from the first electrode layer; or the blocking structure is a ring-shaped recess, the recess has a depth greater than the thickness of the light emitting layer, and the area of the light emitting layer located in a range of the blocking structure is an area of the light emitting layer located on a bottom surface of the recess.

3. The flexible display panel according to claim 1, wherein the blocking structure is a ring-shaped rib made of conductive material, an area where the second electrode layer is located on a surface of the rib away from the first electrode layer and an area where the second electrode layer is located in a range of the preset interval are interruptedly arranged, and the area where the second electrode layer is located in a range of the preset interval is in contact with an inner wall of the rib.

4. The flexible display panel according to claim 3, wherein the rib comprises:
   a first conductive layer arranged on a surface of the peripheral electrode away from the flexible substrate and surrounding the display area; and
   a second conductive layer arranged on a surface of the first conductive layer away from the flexible substrate, wherein the area where the second electrode layer is located in a range of the preset interval is in contact with an inner wall of the second conductive layer.

5. The flexible display panel according to claim 4, wherein the first conductive layer and the peripheral electrode are formed in an integral structure made of transparent conductive material, and the second conductive layer is made of metal.

6. The flexible display panel according to claim 4, wherein the rib further comprises a protective layer arranged on a surface of the second conductive layer away from the flexible substrate.

7. The flexible display panel according to claim 2, wherein an angle between a cross section perpendicular to the flexible substrate in the rib and a surface of the first electrode layer away from the flexible substrate is not less than 90° and not more than 100°.

8. The flexible display panel according to claim 1, wherein the driving layer comprises:
   an active layer arranged on the flexible substrate and located in the display area;
   a gate insulating layer covering the active layer and the flexible substrate;
   a gate electrode arranged on a surface of the gate insulating layer away from the flexible substrate and opposite to the active layer;
   a dielectric layer covering the gate electrode and the gate insulating layer;
   a source-drain layer arranged on a surface of the dielectric layer away from the gate electrode, the source-drain layer comprising a source electrode and a drain electrode connected to the active layer;
   a driving electrode arranged on a surface of the dielectric layer away from the gate electrode and located in the peripheral area; and
   a flat layer covering the dielectric layer, the source-drain layer, and the driving electrode, the first electrode layer being provided on a surface of the flat layer away from the flexible substrate,
   wherein the drain electrode is connected to the first electrode through a first via hole in the flat layer, and the driving electrode is connected to the peripheral electrode through a second via hole in the flat layer.

9. A method for manufacturing a flexible display panel, comprising:
   providing the flexible display panel, wherein the flexible display panel comprises a flexible substrate and a plurality of pixel islands arranged in an array on the flexible substrate, wherein the pixel island has a display area and a peripheral area surrounding the display area;
   forming a driving layer of each pixel island on one side of the flexible substrate;
   forming a first electrode layer of each pixel island on a surface of each driving layer away from the flexible substrate, wherein the first electrode layer comprises a first electrode located in the display area and a peripheral electrode located in the peripheral area, and the peripheral electrode surrounds the display area;
   forming a blocking structure surrounding the display area on a surface of each peripheral electrode away from the flexible substrate, wherein a preset interval exists between the blocking structure and the display area;
   forming a light emitting layer of each pixel island on a surface of each first electrode layer away from the flexible substrate, wherein an area of the light emitting layer located in a range of the blocking structure and an area of the light emitting layer located in a range of the preset interval are interruptedly arranged; and
   forming a second electrode layer of each pixel island on a surface of each light emitting layer away from the flexible substrate.

10. The manufacturing method according to claim 9, wherein:
    the blocking structure is a ring-shaped rib, the rib has a height greater than a thickness of the light emitting layer, and the area of the light emitting layer located in a range of the blocking structure is an area where the light emitting layer is located on a surface of the rib away from the first electrode layer; or
    the blocking structure is a ring-shaped recess, the recess has a depth greater than the thickness of the light emitting layer, and the area of the light emitting layer located in a range of the blocking structure is an area of the light emitting layer located on a bottom surface of the recess.

11. The manufacturing method according to claim 9, wherein the blocking structure is a ring-shaped rib made of conductive material, an area where the second electrode layer is located on a surface of the rib away from the first electrode layer and an area where the second electrode layer is located in a range of the preset interval are interruptedly arranged, and the area where the second electrode layer is located in a range of the preset interval is in contact with an inner wall of the rib.

12. The manufacturing method according to claim 11, wherein forming the blocking structure surrounding the display area on the surface of the peripheral electrode away from the flexible substrate comprises:
    forming a first conductive layer surrounding the display area on a surface of the peripheral electrode away from the flexible substrate; and
    forming a second conductive layer on a surface of the first conductive layer away from the flexible substrate, and the area where the second electrode layer is located in a range of the preset interval is in contact with an inner wall of the second conductive layer.

13. The manufacturing method according to claim 12, wherein both the first conductive layer and the peripheral electrode are made of transparent conductive material and formed by one patterning process, and material of the second conductive layer is metal.

14. The manufacturing method according to claim 12, wherein forming the blocking structure surrounding the display area on the surface of the peripheral electrode away from the flexible substrate further comprises: forming a protective layer on a surface of the second conductive layer away from the flexible substrate.

15. A display apparatus, comprising:
a flexible display panel, wherein the flexible display panel comprises a flexible substrate and a plurality of pixel islands arranged in an array on the flexible substrate, wherein the pixel island has a display area and a peripheral area surrounding the display area, and each of the pixel islands comprises a driving layer, a first electrode layer, a light emitting layer, and a second electrode layer sequentially laminated on the flexible substrate; and
wherein the first electrode layer comprises a first electrode located in the display area and a peripheral electrode located in the peripheral area, the peripheral electrode surrounds the display area, a surface of the peripheral electrode away from the flexible substrate is provided with a blocking structure surrounding the display area, a preset interval exists between the blocking structure and the display area, and an area of the light emitting layer located in a range of the blocking structure and an area of the light emitting layer located in a range of the preset interval are interruptedly arranged.

* * * * *